(12) United States Patent
Cai et al.

(10) Patent No.: US 11,922,335 B2
(45) Date of Patent: Mar. 5, 2024

(54) METHOD AND SYSTEM FOR EVALUATING MACRO RESILIENCE OF OFFSHORE OIL WELL CONTROL EQUIPMENT

(71) Applicant: China University of Petroleum (East China), Qingdao (CN)

(72) Inventors: Baoping Cai, Qingdao (CN); Yonghong Liu, Qingdao (CN); Yanping Zhang, Qingdao (CN); Chuntan Gao, Qingdao (CN); Xiaoyan Shao, Qingdao (CN); Hongqi Xu, Hebei (CN); Xincheng Li, Shandong (CN); Yandong Chen, Hebei (CN); Renjie Ji, Qingdao (CN); Zengkai Liu, Qingdao (CN); Libing Liu, Hebei (CN); Rikui Zhang, Shandong (CN); Yuqian Yang, Shandong (CN); Shitang Liu, Shandong (CN); Xin Wei, Shandong (CN)

(73) Assignee: China University of Petroleum (East China), Qingdao (CN)

( * ) Notice: Subject to any disclaimer, the term of this patent is extended or adjusted under 35 U.S.C. 154(b) by 1125 days.

(21) Appl. No.: 16/704,557

(22) Filed: Dec. 5, 2019

(65) Prior Publication Data
US 2020/0370429 A1    Nov. 26, 2020

(30) Foreign Application Priority Data
May 20, 2019    (CN) .......................... 201910416851.7

(51) Int. Cl.
*G01M 99/00*    (2011.01)
*E21B 43/00*    (2006.01)
(Continued)

(52) U.S. Cl.
CPC ............... *G06N 7/01* (2023.01); *E21B 43/00* (2013.01); *G01V 99/005* (2013.01); *G06F 30/20* (2020.01);
(Continued)

(58) Field of Classification Search
CPC .......... G06N 7/01; G06F 30/20; E21B 43/00; E21B 2200/22; G06Q 10/06; G06Q 50/02; G01M 99/00; G01V 99/005
(Continued)

(56) References Cited

U.S. PATENT DOCUMENTS

2005/0065754 A1    3/2005    Schaf et al.
2014/0095140 A1    4/2014    Weir et al.

FOREIGN PATENT DOCUMENTS

CN    105843208        8/2016
CN    105843208 A  *  8/2016   ......... G05B 23/0208
(Continued)

OTHER PUBLICATIONS

Happonen, T. et al., "Modeling the lifetime of Printed Silver Conductors in Cyclic Bending with the Coffin-Manson Relation," IEEE Transactions on Device and Materials Reliability, vol. 16, No. 1, pp. 25-29, Mar. 2016.
(Continued)

*Primary Examiner* — John E Johansen
(74) *Attorney, Agent, or Firm* — Levine Bagade Han LLP

(57) ABSTRACT

The present disclosure relates to a method and system for evaluating the macro resilience of offshore oil well control equipment. The method for evaluating the macro resilience of offshore oil well control equipment comprises six steps: determining the type and strength of external disaster; calculating the failure rate of components; calculating the recovery rate of the components; modeling the BN for a degradation process; modeling the BN for a maintenance
(Continued)

process; and calculating the resilience of the offshore oil well control equipment. A system for evaluating the macro resilience of offshore oil well control equipment comprises an external disaster evaluation module, a component failure rate calculation subsystem, a reliability degradation process simulation module, a fault identification module, a component recovery rate calculation module, a reliability recovery process simulation module, a reliability change curve derivation unit and an resilience calculation unit.

2 Claims, 5 Drawing Sheets

(51) Int. Cl.
    *G01V 99/00*         (2009.01)
    *G06F 30/20*         (2020.01)
    *G06N 7/01*          (2023.01)
    *G06Q 10/06*        (2023.01)
    *G06Q 50/02*        (2012.01)

(52) U.S. Cl.
    CPC .......... *G06Q 10/06* (2013.01); *E21B 2200/22* (2020.05); *G01M 99/00* (2013.01); *G06Q 50/02* (2013.01)

(58) Field of Classification Search
    USPC .......................................................... 703/10
    See application file for complete search history.

(56) References Cited

FOREIGN PATENT DOCUMENTS

| | | | | |
|---|---|---|---|---|
| CN | 106227906 | | 12/2016 | |
| CN | 107506555 | | 12/2017 | |
| CN | 107545339 | | 1/2018 | |
| CN | 108090489 | A * | 5/2018 | ............. G06K 9/342 |
| CN | 109270461 | A * | 1/2019 | |
| CN | 109710965 | | 5/2019 | |

OTHER PUBLICATIONS

Zhou, Zhen et al., "Application of Bayesian method in determining safety instrumented system equipment failure rate," China Safety Science Journal, vol. 25, No. 7, pp. 93-97, Jul. 2015.

* cited by examiner

METHOD AND SYSTEM FOR EVALUATING MACRO RESILIENCE OF OFFSHORE OIL WELL CONTROL EQUIPMENT

CROSS-REFERENCE TO RELATED APPLICATION

This application claims priority to Chinese patent application No. 2019104168517 filed on May 20, 2019, entitled "Method and System for Evaluating Macro Resilience of Offshore Oil Well Control Equipment," which is incorporated herein by reference in its entirety.

BACKGROUND

Technical Field

The present disclosure belongs to the field of marine engineering, and in particular relates to a method and system for evaluating a macro resilience of offshore oil well control equipment.

Description of the Related Art

Offshore oil development is one of the important energy industries in the world today, and the exploitation of offshore oil involves more risks than that of onshore oil due to the bad working environment. The offshore oil well control equipment, which is an important tool to ensure the exploitation of offshore oil, has always aroused much attention on its resilience problem. In the engineering field, resilience refers to the ability that an engineering system responds and restores its original state after being subjected to unforeseen disturbances or events. The performance of offshore oil well control equipment will be degraded or even its function is completely lost under disasters of severe weather such as typhoons, earthquakes and tsunami; and the performance of the well control equipment will be gradually increased and eventually remain in a stable state after the maintenance measures are taken.

Existing methods for evaluating the resilience are mostly applicable to the infrastructure fields such as power grid systems, communication systems, and transportation systems, and rarely applied to the field of marine engineering. In addition, the existing methods for evaluating the resilience are generally only directed at one or several specific disasters, and cannot be applied to all types of disasters, and thus they have certain limitations; during the evaluation of the resilience, the failure rates of components are usually determined by expert's experience, and there is a big error compared with the actual situation.

BRIEF SUMMARY

In order to overcome the defects of the existing methods for evaluating the resilience, the present disclosure provides a method and system for evaluating a macro resilience of an offshore oil well control equipment.

In order to achieve the object above, according to an aspect of the present disclosure, a method for evaluating the macro resilience of an offshore oil well control equipment is provided, comprising six steps:

step 1: determining the type and strength of external disaster; specifically, under the same failure mechanism, the reliability degradation process of components of the well control equipment under the external disaster is equivalent to the reliability degradation process of the components in an acceleration test, and an acceleration model is used to quantitatively describe the reliability degradation process; influence factors for the failure times of the components of the well control equipment are determined after the determination of the type of the disaster; and the value range of variables in the acceleration model are determined after the determination of the strength of the disaster; relevant data of the external disaster are collected by sensors and subjected to data analysis and data processing so as to determine by which kind of factors the components of the offshore oil well control equipment are influenced;

step 2, calculating the failure rates of the components of the offshore oil well control equipment; specifically, the influence factors for the failure times of the components of the offshore oil well control equipment are divided into four types: temperature, humidity, vibration and electrical stress; under the influence of external disaster, the components may be influenced by only one factor, that is, single-factor action, or may be influenced by multiple factors, that is, multi-factor action; after the determination of the degradation acceleration model of the components, the physical model is mapped to a Bayesian network (BN), and the failure time distribution and probability of the components are determined by the computational results of the BN;

step 3, calculating the recovery rates of the components of the offshore oil well control equipment; specifically, the relevant data of the well control equipment after the disaster are collected by the sensor, the degree of damage of the well control equipment is determined, a corresponding maintenance strategy is then decided by an expert, and maintenance times of the well control equipment are obtained through the maintenance strategy, thereby calculating the recovery rates of the well control equipment;

step 4, modeling the BN for the degradation process of the offshore oil well control equipment; specifically, a static BN for simulating change in the reliability of the well control equipment is established firstly, the nodes changing with time in the static BN are determined, and the static BN is extended into a dynamic Bayesian Network (DBN); in terms of parameter modeling, the priori probability of the BN for the degradation process of the offshore oil well control equipment is decided by states of the components of the well control equipment, and the degradation process follows the exponential degradation law;

step 5, modeling the BN for the maintenance process of the offshore oil well control equipment; specifically, a static BN for simulating change in the reliability of the well control equipment is established firstly, the nodes changing with time in the static BN are determined, and the static BN is extended into a DBN; in terms of structure, the BNs for the degradation process and the maintenance process of the offshore oil well control equipment are the same, and the modeling is performed on the same set of offshore oil well control equipment; in terms of parameter modeling, the priori probability of the BN for the maintenance process of the offshore oil well control equipment is decided by states of the components of the well control equipment, and the recovery process follows the Markov law; and step 6, calculating the resilience of the offshore oil well control equipment; specifically, the reliability versus the change in time of the offshore oil well control equipment after being subjected to disaster and maintenance measures are respectively obtained through the BN; and the reliability degradation and recovery curves are drawn through the computational results of the BN, and the specific resilience value of the system is obtained by calculating the area ratio.

According to another aspect of the present disclosure, a system for evaluating the resilience of an offshore oil well control equipment includes an external disaster evaluation module, a component failure rate calculation subsystem, a reliability degradation process simulation module, a fault identification module, a component recovery rate calculation module, a reliability recovery process simulation module, a reliability change curve derivation unit, and an resilience calculation unit.

The external disaster evaluation module includes an external disaster data collection unit, a disaster data processing unit, and a disaster data output unit; wherein the external disaster data collection unit is connected with sensors; the disaster data processing unit is connected with the external disaster data collection unit through cables; and the disaster data output unit is connected with the disaster data processing unit through cables.

The component failure rate calculation subsystem includes a component failure rate calculation module under single-stress influence, a component failure rate calculation module under multi-stress influence and a component failure rate output unit; the component failure rate calculation module under single-stress influence includes an influence factor and strength acquisition unit under single-stress influence, a degradation model selection unit under single-stress influence, a Bayesian mapping unit of degradation model under single-stress influence, and a component failure rate calculation unit under single-stress influence; wherein the influence factor and strength acquisition unit under single-stress influence is connected with the disaster data output unit through cables; the degradation model selection unit under single-stress influence is connected with the influence factor and strength acquisition unit under single-stress influence through cables; the Bayesian mapping unit of the degradation model under single-stress influence is connected with the degradation model selection unit under single-stress influence through cables; and the component failure rate calculation unit under single-stress influence is connected with the Bayesian mapping unit of degradation model under single-stress influence through cables; the component failure rate calculation module under multi-stress influence includes: an influence factor and strength acquisition unit under multi-stress influence, a degradation model selection unit under multi-stress influence, a Bayesian mapping unit of degradation model under multi-stress influence, a component failure rate coupling unit under multi-stress influence, and a component failure rate calculation unit under multi-stress influence; wherein the influence factor and strength acquisition unit under multi-stress influence is connected with the disaster data output unit through cables; the degradation model selection unit under multi-stress influence is connected with the influence factor and strength acquisition unit under multi-stress influence through cables; the Bayesian mapping unit of degradation model under multi-stress influence is connected with the degradation model selection unit under multi-stress influence through cables; the component failure rate coupling unit under multi-stress influence is connected with the Bayesian mapping unit of degradation model under multi-stress influence through cables; the component failure rate calculation unit under multi-stress influence is connected with the component failure rate coupling unit under multi-stress influence through cables; and the component failure rate output unit is connected with the component failure rate calculation unit under single-stress influence and the component failure rate calculation unit under multi-stress influence through cables, respectively.

The reliability degradation process simulation module includes: a performance degradation process static BN import unit, a performance degradation process DBN extension unit, a performance degradation process reliability output unit, and a performance degradation process reliability curve fitting unit; wherein the performance degradation process static BN import unit is connected with the component failure rate output unit through cables; the performance degradation process DBN extension unit is connected with the performance degradation process static BN import unit through cables; the performance degradation process reliability output unit is connected with the performance degradation process DBN extension unit through cables; and the performance degradation process reliability curve fitting unit is connected with the performance degradation process reliability output unit through cables.

The fault identification module includes: a performance data collection unit, a performance data processing unit, a performance data output unit, and a fault level output unit; wherein the performance data collection unit is connected with the underwater offshore oil well control equipment through cables; the performance data processing unit is connected with the performance data collection unit through cables; the performance data output unit is connected with the performance data processing unit through cables; and the fault level output unit is connected with the performance data output unit through cables.

The component recovery rate calculation module includes: a maintenance decision unit, a maintenance data output unit, and a component recovery rate calculation unit; wherein the maintenance decision unit is connected with the fault level output unit through cables; the maintenance data output unit is connected with the maintenance decision unit through cables; and the component recovery rate calculation unit is connected with the maintenance data output unit through cables.

The reliability recovery process simulation module includes a performance recovery process static BN import unit, a performance recovery process DBN extension unit, a performance recovery process reliability output unit, and a performance recovery process reliability curve fitting unit; wherein the performance recovery process static BN import unit is connected with the component recovery rate calculation unit through cables; the performance recovery process DBN extension unit is connected with the performance recovery process static BN import unit through cables; the performance recovery process reliability output unit is connected with the performance recovery process DBN extension unit through cables; and the performance recovery process reliability curve fitting unit is connected with the performance recovery process reliability output unit through cables.

Compared with the prior art, the present disclosure has the beneficial effects that: a method for evaluating the macro resilience of the offshore oil well control equipment only involves attribute parameters inside the system and is not limited by the types of external disasters; by obtaining the failure time distribution and probability of the components of the offshore oil well control equipment through mapping the physical model into BN, the problem that the errors of the failure rate value occur in the resilience evaluation process is solved; in the maintenance process, the offshore oil well control equipment is maintained from an overall and systematic perspective without considering the degradation and maintenance of each specific component of the well control equipment, and thus the abilities that the system withstands the next disaster and recovers are enhanced, thereby improving the resilience of the system.

Figure 1:
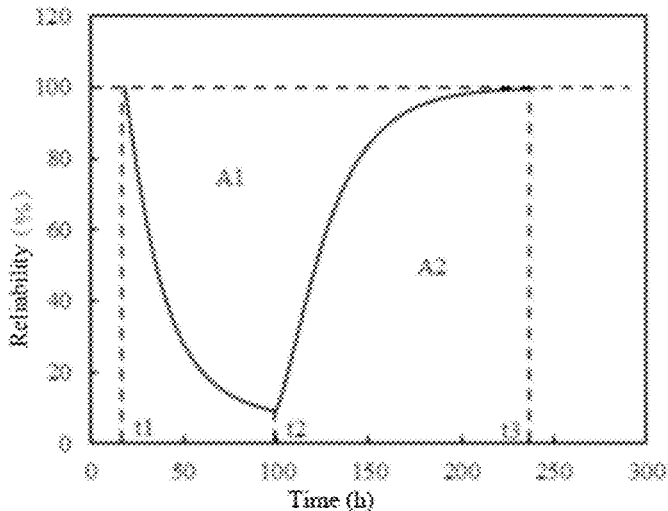
FIG. 1 is a curve showing the change in the reliability of offshore oil well control equipment under external disaster.

DESCRIPTION OF THE REFERENCE NUMBERS 1 external disaster evaluation module
2 component failure rate calculation subsystem
3 reliability degradation process simulation module
4 fault identification module
5 component recovery rate calculation module
6 reliability recovery process simulation module
7 component failure rate calculation module under single-stress influence
8 component failure rate calculation module under multi-stress influence
9 external disaster data collection unit
10 disaster data processing unit
11 disaster data output unit
12 influence factor and strength acquisition unit under multi-stress influence
13 influence factor and strength acquisition unit under single-stress influence
14 degradation model selection unit under multi-stress influence
15 degradation model selection unit under single-stress influence
16 Bayesian mapping unit of degradation model under multi-stress influence
17 Bayesian mapping unit of degradation model under single-stress influence
18 component failure rate coupling unit under multi-stress influence
19 component failure rate calculation unit under multi-stress influence
20 component failure rate calculation unit under single-stress influence
21 component failure rate output unit
22 performance degradation process static BN import unit
23 performance degradation process DBN extension unit
24 performance degradation process reliability output unit
25 performance degradation process reliability curve fitting unit
26 performance data collection unit
27 performance data processing unit
28 performance data output unit
29 fault level output unit
30 maintenance decision unit
31 maintenance data output unit
32 component recovery rate calculation unit
33 performance recovery process static Bayeux network import unit
34 performance recovery process DBN extension unit
35 performance recovery process reliability output unit
36 performance recovery process reliability curve fitting unit
37 reliability change curve output unit
38 resilience calculation unit

DETAILED DESCRIPTION

As shown in FIG. 1, the resilience of offshore oil well control equipment refers to the ability that a system responds and restores its original state after being subjected to unforeseen disturbances or events. At time t1, the offshore oil well control equipment is attacked by typhoon, earthquake or tsunami, and the reliability level of the system is gradually degraded under the action of the disaster loads. After the disaster occurred for a period of time and the maintenance strategy decision, maintenance personnel transfer, maintenance equipment preparation measures were ready, that is, at time t2, the maintenance measures are taken for the offshore oil well control equipment, the reliability level of the system is gradually increased, and eventually remains in a stable state at time t3.

Figure 2:
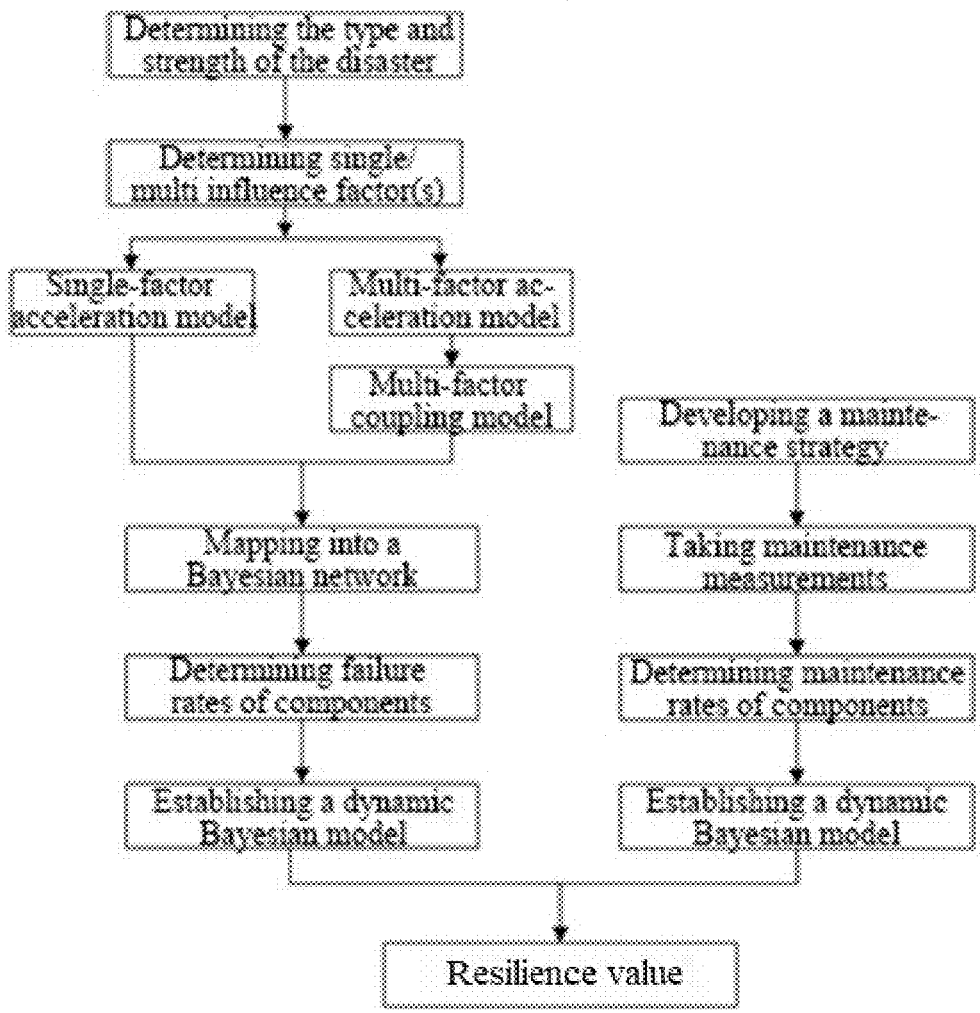
FIG. 2 is a flow chart of a method for evaluating for the macro resilience of the offshore oil well control equipment.

As shown in FIG. 2, a method for evaluating the macro resilience of an offshore oil well control equipment comprises:

Step 1: determining the type and strength of external disaster. Under the same failure mechanism, the reliability degradation process of components of the well control equipment under the external disaster is equivalent to the reliability degradation process of the components in an acceleration test, and an acceleration model is used to quantitatively describe the reliability degradation process. Influence factors for the failure times of the components of the well control equipment are determined after the determination of the type of the disaster; and the value range of variables in the acceleration model are determined after the determination of the strength of the disaster. Relevant data of the external disaster are collected by sensors and subjected to data analysis and data processing so as to determine by which kind of factors the components of the offshore oil well control equipment are influenced.

Step 2, calculating the failure rates of the components of the offshore oil well control equipment. The influence factors for the failure times of the components of the offshore oil well control equipment are divided into four types: temperature, humidity, vibration and electrical stress. Under the influence of external disaster, the components may be influenced by only one factor, that is, single-factor action, or may be influenced by multiple factors, that is, multi-factor action.

When the components of the offshore oil well control equipment are subjected to a single-stress action:

S211, determining a degradation model of the offshore oil well control equipment component under the influence of the external disaster.

(1) When the well control equipment is influenced by temperature, an acceleration model of the failure time degradation of the component is shown in formula (1):

$$\frac{1}{t} = Ae^{-Ea/KT} \quad (1)$$

wherein t is a pre-failure time of the component; A is a pre-exponential factor; Ea is an activation energy; K is the Boltzmann constant; and T is an absolute temperature, which is related to the strength of the disaster.

(2) When the well control equipment is influenced by humidity, an acceleration model of the failure time degradation of the component is shown in formula (2):

$$t = (RH)^{-n} \cdot \exp(Ea/KT) \quad (2)$$

wherein t is a pre-failure time; RH is a relative humidity, which is related to the strength of the external disaster; Ea is an activation energy; K is the Boltzmann constant, KJ/(mol·K); T is an absolute temperature; and n is an exponent, and its value is a constant.

(3) When the well control equipment is influenced by vibration, an acceleration model of the failure time degradation of the component is shown in formula (3):

$$\Delta\varepsilon_p = C \times \frac{\sigma'_f}{E}(N_f)^{-n} \quad (3)$$

wherein $\Delta\varepsilon_p$ is a strain range, its value is related to the strength of the external disaster; $\sigma'_f$ is a fatigue strength coefficient; E is an elastic modulus; and $N_f$ is the life cycle, that is, the failure time.

(4) When the well control equipment is influenced by electrical stress, an acceleration model of the failure time degradation of the component is shown in formula (4):

$$L = L_0 V^{-n} \quad (4)$$

wherein L is a failure time; $L_0$ is a constant; n is an exponent; and V is the electrical stress, which value is related to the strength of the external disaster.

S212, mapping the degradation model of the components of the offshore oil well control equipment into a BN.

Figure 3:
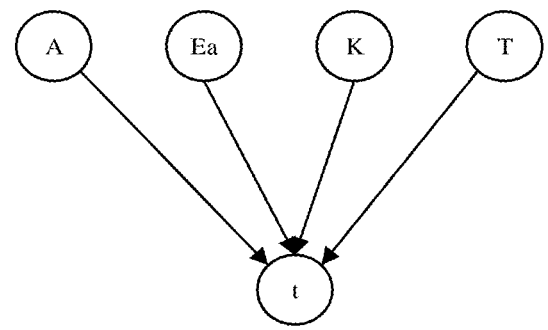
FIG. 3 is a BN of a degradation model under the influence of temperature.

(1) The formula (1) is mapped into a BN as shown in FIG. 3, to obtain the failure time distribution and probability of the components of the well control equipment under the influence of temperature. The BN is divided into two layers: a first layer including four nodes of A, Ea, K, and T as an influence factor layer; and a second layer including one node of the failure time t as a result layer, and the computational results indicate the failure time distribution and probability of the components of the offshore oil well control equipment under the influence of the temperature.

Figure 4:
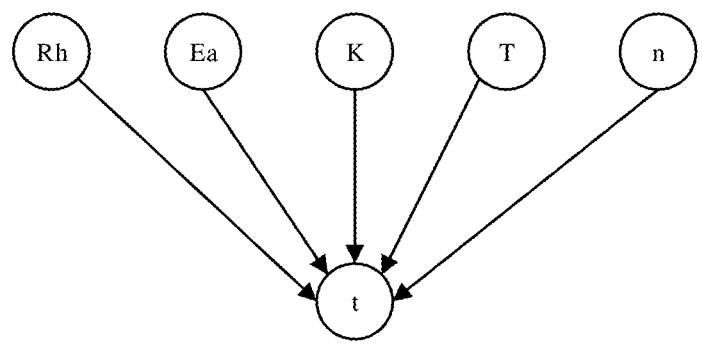
FIG. 4 is a BN of a degradation model under the influence of humidity.

(2) The formula (2) is mapped into a BN as shown in FIG. 4, to obtain the failure time distribution and probability of the components of the well control equipment under the influence of the humidity. The BN is divided into two layers: a first layer including five nodes of Rh, Ea, K, T, and n as an influence factor layer; and a second layer including one node of the failure time t as a result layer, and the computational results indicate the failure time distribution and probability of the components of the offshore oil well control equipment under the influence of the humidity.

Figure 5:
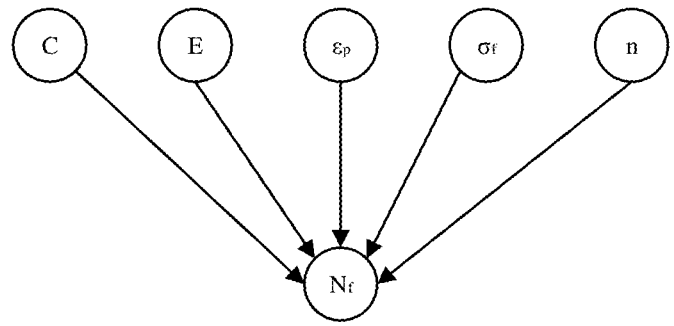
FIG. 5 is a BN of a degradation model under the influence of vibration.

(3) The formula (3) is mapped into a BN as shown in FIG. 5, to obtain the failure time distribution and probability of the components of the well control equipment under the influence of the vibration. The BN is divided into two layers: a first layer including five nodes of C, E, $\varepsilon_p$, $\sigma_f$, and n as an influence factor layer; and a second layer including one node of the failure time $N_f$ as a result layer, and the computational results indicate the failure time distribution and probability of the components of the offshore oil well control equipment under the influence of the vibration.

Figure 6:
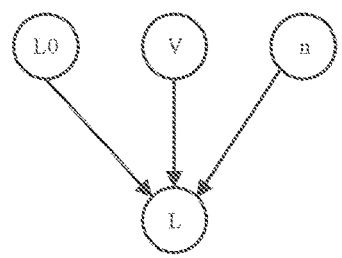
FIG. 6 is a BN of a degradation model under the influence of electrical stress.

(4) The formula (4) is mapped into a BN as shown in FIG. 6, to obtain the failure time distribution and probability of the components of the well control equipment under the influence of the electrical stress. The BN is divided into two layers: a first layer including three nodes of $L_0$, V, and n as an influence factor layer; and a second layer including one node of the failure time L as a result layer, and the computational results indicate the failure time distribution and probability of the components of the offshore oil well control equipment under the influence of the electrical stress.

S213, calculating the failure rates of the components of the offshore oil well control equipment under single-stress influence. The failure rates of the components of the offshore oil well control equipment under single-stress influence are calculated through a weighting method.

When the components of the offshore oil well control equipment are subjected to a multi-stress action:

S221, determining a degradation model of the offshore oil well control equipment component under the influence of the external disaster. The degradation model formula is the same as that in S211 except that: the number of degradation models of the components is greater than one under the multi-factor influence, and it is necessary to determine the degradation models of the components of the offshore oil well control equipment under different influence factors respectively.

S222, mapping the degradation model of the components of the offshore oil well control equipment into a BN. Similar to step S212, the different degradation models are mapped into BNs, respectively, to obtain the failure time distribution and probability of the components of the offshore oil well control equipment under different influence factors.

S223, coupling the failure times of the components of the well control equipment under different influence factors. When the components of the well control equipment are influenced by multi-stress, the failure times under single-factor influence are coupled using formula (5) after the failure times of the components under single-factor influence are determined respectively, and the formula (5) is mapped into a BN, to obtain the failure time distribution and probability of the components of the offshore oil well control equipment under multi-factor influence. The formula (5) is shown as follows:

$$D_{total} = \sum_{i=1}^{p} \frac{n_i}{N_i} \quad (5)$$

wherein $n_i$ is a coupling correction factor; $N_i$ is the failure times of the components under single-factor influence; and p is the number of influence factors.

Step 3, calculating the recovery rates of the components of the offshore oil well control equipment. The relevant data of the well control equipment after the disaster are collected by the sensor, the degree of damage of the well control equipment is determined, a corresponding maintenance strategy is then decided by experts, and maintenance times of the well control equipment are obtained through the maintenance strategy, thereby calculating the recovery rates of the well control equipment.

Step 4, modeling the BN for the degradation process of the offshore oil well control equipment. A static BN for simulating change in the reliability of the well control equipment is established firstly, the nodes changing with time in the static BN are determined, and the static BN is extended into a DBN. In terms of parameter modeling, the priori probability of the BN for the degradation process of the offshore oil well control equipment is decided by states of the components of the well control equipment respectively, and the degradation process follows the exponential degradation law.

Step 5, modeling the BN for the maintenance process of the offshore oil well control equipment. A static BN for simulating change in the reliability of the well control equipment is established firstly, the nodes changing with time in the static BN are determined, and the static BN is extended into a DBN. In terms of structure, the BNs for the degradation process and the maintenance process of the offshore oil well control equipment are the same, and the modeling is performed on the same set of offshore oil well control equipment. In terms of parameter modeling, the priori probability of the BN for the maintenance process of the offshore oil well control equipment is decided by states of the components of the well control equipment, and the recovery process follows the Markov law.

Figure 7:
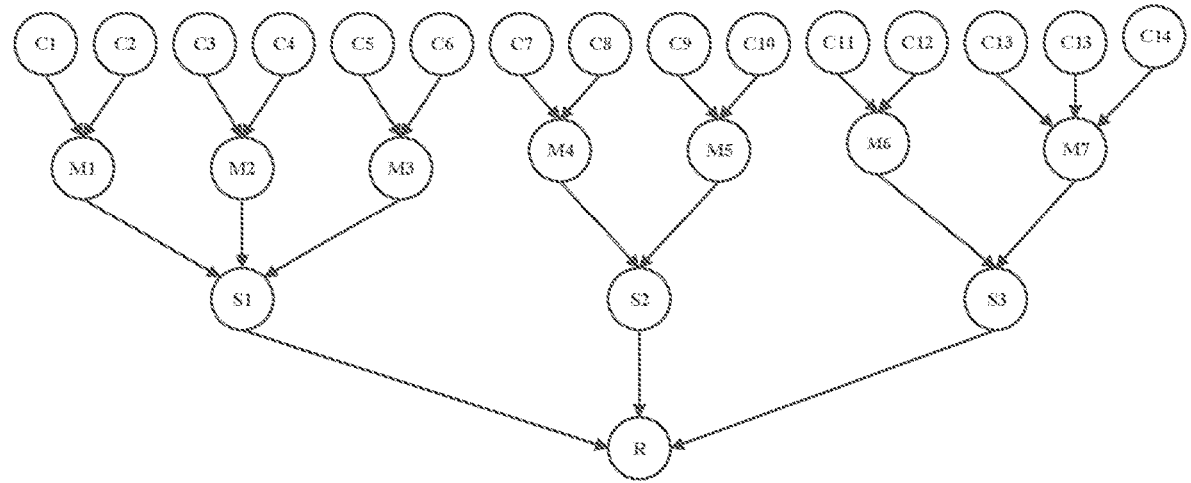
FIG. 7 is a schematic diagram showing a static BN of the offshore oil well control equipment.

In FIG. 7, the first layer nodes C1, C2, C3, C4, C5, C6, C7, C8, C9, C10, C11, C12, C13, C14 are parent nodes, which represent basic components of the well control equipment; the second layer nodes M1, M2, M3, M4, M5 and M6 are intermediate nodes, which represent the series-parallel relations of the components of the well control equipment, the conditional transition probability table is determined by the series-parallel relations; the third layer nodes S1, S2 and S3 represent subsystems in the offshore oil well control equipment; and the fourth layer node R represents the reliability of the offshore oil well control equipment.

Figure 8:
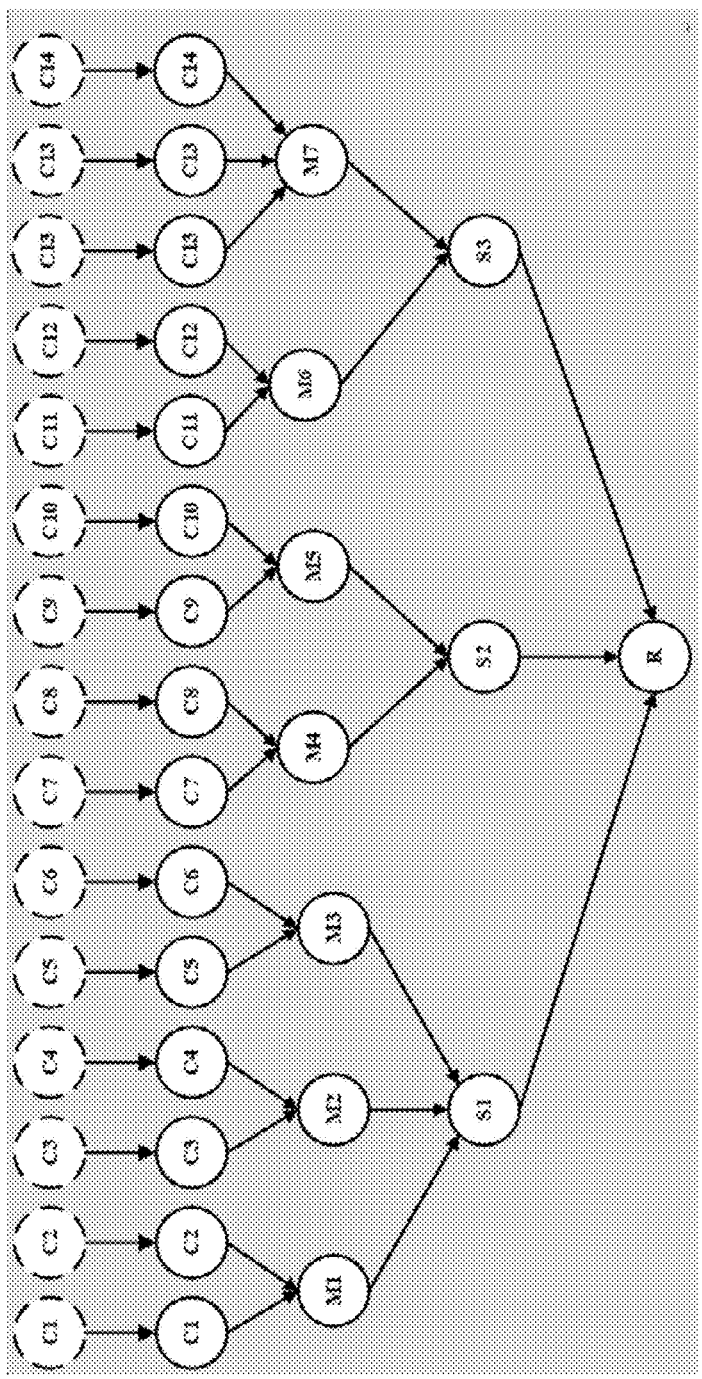
FIG. 8 is a schematic diagram showing a dynamic BN of the offshore oil well control equipment.

In FIG. 8, the static BN of FIG. 7 is extended in time, wherein the first layer nodes are time clone nodes of the basic components C1, C2, C3, C4, C5, C6, C7, C8, C9, C10, C11, C12, C13, C14 of the well control equipment, which represent the temporal change relations of the components of the offshore oil well control equipment; the second layer nodes C1, C2, C3, C4, C5, C6, C7, C8, C9, C10, C11, C12, C13, C14 represent the components of the well control equipment; the third layer nodes M1, M2, M3, M4, M5, M6 are intermediate nodes, which represent the series-parallel relations of the components of the well control equipment, the series-parallel relation is determined by the conditional transition probability table; the fourth layer nodes S1, S2, S3 represent subsystems in the offshore oil well control equipment; and the fifth layer node R represents the reliability of the offshore oil well control equipment.

Step 6, calculating the resilience of the offshore oil well control equipment. The reliability versus the change in time of the offshore oil well control equipment after being subjected to disaster and maintenance measures are respectively obtained through the BN. The reliability degradation and the recovery curves are drawn through the computational results of the BN, and the specific resilience value of the system is obtained by calculating the area ratio. The calculation method is as follows: when the resilience value is calculated, a perpendicular line is drawn from the reliability point at the time of occurrence of the disaster to an x-axis, perpendicular lines are drawn from the reliability point at time of the completion of the maintenance measures to x-axis and the y-axis respectively, the area enclosed by a curve and a straight line in the horizontal direction is called A1, and the area enclosed by the curve and the two perpendicular lines as well as the x-axis is called A2, and the sum of A1 and A2 is the total area. The ratio of the area of A2 to the total area is the required resilience value.

Figure 9:
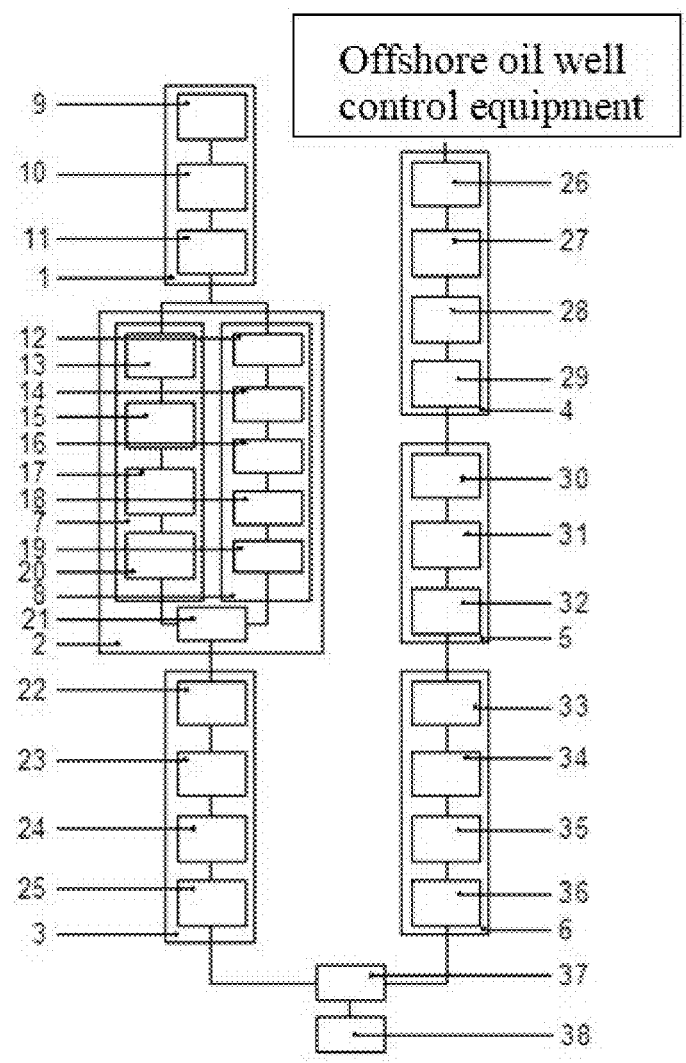
FIG. 9 is a schematic diagram showing a system for evaluating the macro resilience of the offshore oil well control equipment.

As shown in FIG. 9, a system for evaluating the resilience of an offshore oil well control equipment includes an external disaster evaluation module 1, a component failure rate calculation subsystem 2, a reliability degradation process simulation module 3, a fault identification module 4, a component recovery rate calculation module 5, a reliability recovery process simulation module 6, a reliability change curve derivation unit 37, and an resilience calculation unit 38.

The external disaster evaluation module 1 includes an external disaster data collection unit 9, a disaster data processing unit 10, and a disaster data output unit 11; wherein the external disaster data collection unit 9 is connected with sensors through cables, for collecting relevant data of the external disaster; the disaster data processing unit 10 is connected with the external disaster data collection unit 9 through cables, for processing the collected relevant data of the external disaster; and the disaster data output unit 11 is connected with the disaster data processing unit 10 through cables, for transferring the processed data of the external disaster to a next module.

The component failure rate calculation subsystem 2 includes a component failure rate calculation module under single-stress influence 7, a component failure rate calculation module under multi-stress influence 8 and a component failure rate output unit 21; wherein the component failure rate calculation module under single-stress influence 7 includes an influence factor and strength acquisition unit under single-stress influence 13, a degradation model selection unit under single-stress influence 15, a Bayesian mapping unit of degradation model under single-stress influence 17, and a component failure rate calculation unit under single-stress influence 20; the influence factor and strength acquisition unit under single-stress influence 13 is connected with the disaster data output unit through cables, for acquiring single influence factor and strength generated for the components of the offshore oil well control equipment by the external disaster; the degradation model selection unit under single-stress influence 15 is connected with the influence factor and strength acquisition unit under single-stress influence 13 through cables, for selecting a corresponding physical model to calculate the failure time of the offshore oil well control equipment component under the action of the corresponding stress; the Bayesian mapping unit of degradation model under single-stress influence 17 is connected with the degradation model selection unit under single-stress influence 15 through cables, for converting the corresponding physical model into a BN, and obtaining the failure time distribution and probability of the components of the well control equipment under the action of single factor; and the component failure rate calculation unit under single-stress influence 20 is connected with the Bayesian mapping unit of degradation model under single-stress influence 17 through cables, for calculating the weighting of the failure time and probability of the components of the well control equipment under single-stress influence, to obtain failure rates of the components; the component failure rate calculation module under multi-stress influence 8 includes: an influence factor and strength acquisition unit under multi-stress influence 12, a degradation model selection unit under multi-stress influence 14, a Bayesian mapping unit of degradation model under multi-stress influence 12, a component failure rate coupling unit under multi-stress influence 18, and a component failure rate calculation unit under multi-stress influence 19; wherein the influence factor and strength acquisition unit under multi-stress influence 12 is connected with the disaster data output unit 11 through cables, for acquiring a plurality of influence factors and strength generated for the components of the offshore oil well control equipment by the external disaster; the degradation model selection unit under multi-stress influence 14 is connected with the influence factor and strength acquisition unit under multi-stress influence 16 through cables, for selecting a corresponding physical model to calculate the failure times of the components of the offshore oil well control equipment under the action of different factors; the Bayesian mapping unit of degradation model under multi-stress influence 16 is connected with the degradation model selection unit 14 under multi-stress influence through cables, for converting the corresponding physical models into BNs, and obtaining the failure time distribution and probability of the components of the offshore oil well control equipment under the action of different factors; the component failure rate coupling unit under multi-stress influence 18 is connected with the Bayesian mapping unit of degradation model under multi-stress influence 16 through cables, for coupling the failure rates of the components of the offshore oil well control equipment obtained under different stresses, to calculate the failure time distribution and probability of the components of the offshore oil well control equipment under multi-stress influence; the component failure rate calculation unit under multi-stress influence 19 is connected with the component failure rate coupling unit under multi-stress influence 18 through cables, for calculating the weighting of the failure times and probability of the components of the offshore oil well control equipment obtained under multi-stress influence, to obtain failure rates of the components of the offshore oil well control equipment; and the component failure rate output unit 21 is connected with the component failure rate calculation unit under single-stress influence 20 and the component failure rate calculation unit under multi-stress influence 19 through cables, respectively, for outputting the failure rates of the components of the offshore oil well control equipment under the influence of external disasters.

The reliability degradation process simulation module 3 includes: a performance degradation process static BN import unit 22, a performance degradation process DBN extension unit 23, a performance degradation process reliability output unit 24, and a performance degradation process reliability curve fitting unit 25; wherein the performance degradation process static BN import unit 22 is connected with the component failure rate output unit 21 through cables, for inputting the failure rates of the components of the offshore oil well control equipment into the import BN; the performance degradation process DBN extension unit 23 is connected with the performance degradation process static BN import unit 22 through cables, for extending the static BN into the DBN; the performance degradation process reliability output unit 24 is connected with the performance degradation process DBN extension unit 23 through cables, for outputting the computational results of the DBN, to obtain the reliability of the offshore oil well control equipment at each time point; and the performance degradation process reliability curve fitting unit 25 is connected with the performance degradation process reliability output unit 24 through cables, for fitting a reliability change curve of the offshore oil well control equipment for a certain period of time.

The fault identification module 4 includes: a performance data collection unit 26, a performance data processing unit 27, a performance data output unit 28, and a fault level output unit 29; wherein the performance data collection unit 26 is connected with the underwater offshore oil well control equipment through cables, for collecting performance-relevant data of the offshore oil well control equipment after the disaster by the sensors; the performance data processing unit 27 is connected with the performance data collection unit 26 through cables, for processing the collected data; the performance data output unit 28 is connected with the performance data processing unit 27 through cables, for outputting the processed data; and the fault level output unit 29 is connected with the performance data output unit 28 through cables, for judging the fault degree of the offshore oil well control equipment which is divided into three levels, namely mild fault, moderate fault and severe failure.

The component recovery rate calculation module 5 includes a maintenance decision unit 30, a maintenance data output unit 31, and a component recovery rate calculation unit 32; wherein the maintenance decision unit 30 is connected with the fault level output unit 29 through cables, for judging which maintenance measure should be taken for different degrees of the fault; the maintenance data output unit 31 is connected with the maintenance decision unit 30 through cables, for determining and outputting the maintenance time data of the offshore oil well control equipment; and the component recovery rate calculation unit 32 is connected with the maintenance data output unit 31 through cables, for calculating the recovery rates of the components of the offshore oil well control equipment under the corresponding maintenance measures.

The reliability recovery process simulation module 6 includes a performance recovery process static BN import unit 33, a performance recovery process DBN extension unit 34, a performance recovery process reliability output unit 35, and a performance recovery process reliability curve fitting unit 36; wherein the performance recovery process static BN import unit 33 is connected with the component recovery rate calculation unit 32 through cables, for inputting the recovery rates of the components of the offshore oil well control equipment into the import BN; the performance recovery process DBN extension unit 34 is connected with the performance recovery process static BN import unit 33 through cables, for extending the static BN into the DBN; the performance recovery process reliability output unit 35 is connected with the performance recovery process dynamic BN extension unit 34 through cables, for outputting the computational results of the DBN, to obtain the reliability of the offshore oil well control equipment at each time point; and the performance recovery process reliability curve fitting unit 36 is connected with the performance recovery process reliability output unit 35 through cables, for fitting a reliability change curve of the offshore oil well control equipment for a certain period of time.

The reliability change curve derivation unit 37 is connected with the performance degradation process reliability curve fitting unit 25 and the performance recovery process reliability curve fitting unit 36 through cables respectively, for fitting the reliability change curve of the offshore oil well control equipment during the period from the start of the disaster to the completion of the maintenance; and the resilience calculation unit 38 is connected with the reliability change curve derivation unit 37 through cables, for calculating and evaluating the resilience of the offshore oil well control equipment.

The external disaster evaluation module 1 is mainly used for completing the step of determining the types and strength of the external disaster; the component failure rate calculation subsystem 2 is mainly used for completing the step of calculating the failure rates of the components; the reliability degradation process simulation module 3 is mainly used for completing the step of modeling the BN for the degradation process; the fault identification module 4 and the component recovery rate calculation module 5 are mainly used for completing the step of calculating the recovery rates of the components; the reliability recovery process simulation module 6 is mainly used for completing the step of modeling the BN for the maintenance process; and the reliability change curve derivation unit 37 and the resilience calculation unit 38 are mainly used for completing the step of calculating the resilience of the offshore oil well control equipment.

The invention claimed is:

1. A method for evaluating the macro resilience of an offshore oil well control equipment, comprising six major steps: determining the type and strength of external disaster; calculating failure rates of components of the offshore oil well control equipment; calculating recovery rates of the components of the offshore oil well control equipment; modeling Bayesian networks (BNs) for degradation process of the offshore oil well control equipment; modeling BNs for maintenance process of the offshore oil well control equipment; and calculating the resilience of the offshore oil well control equipment;

step 1: determining the type and strength of the external disaster; under the same failure mechanism, a reliability degradation process of the components of the well control equipment under the external disaster is equivalent to a reliability degradation process of the components in an acceleration test, and an acceleration model is used to quantitatively describe the reliability degradation process; influence factors for failure times of the components of the well control equipment are determined after the determination of the type of the disaster; and a value range of variables in the acceleration model are determined after the determination of the strength of the disaster; relevant data of the external disaster are collected by sensors and subjected to data analysis and data processing so as to determine by which kind of factors the components of the offshore oil well control equipment are influenced;

step 2, calculating the failure rates of the components of the offshore oil well control equipment; the influence factors for the failure times of the components of the offshore oil well control equipment are divided into four types: temperature, humidity, vibration and electrical stress; under the influence of the external disaster, the components may be influenced by only one factor, that is, single-factor action, or may be influenced by multiple factors, that is, multi-factor action; after the determination of the degradation acceleration model of the components, a physical model is mapped into a BN, and failure time distribution and probability of the components are determined by the computational results of the BN;

step 3, calculating the recovery rates of the components of the offshore oil well control equipment; relevant data of the well control equipment after the disaster are collected by the sensor, the degree of damage of the well control equipment is determined, a corresponding maintenance strategy is then decided by an expert, and maintenance times of the well control equipment are obtained through the maintenance strategy, thereby calculating the recovery rates of the well control equipment;

step 4, modeling the BN for the degradation process of the offshore oil well control equipment; a static BN for simulating change in the reliability of the well control equipment is established firstly, the nodes changing with time in the static BN are determined, and the static BN is extended into a dynamic Bayesian network (DBN); in terms of parameter modeling, priori probability of the BN for the degradation process of the offshore oil well control equipment is decided by states of the components of the well control equipment, and the degradation process follows an exponential degradation law;

step 5, modeling the BN for the maintenance process of the offshore oil well control equipment; a static BN for simulating change in the reliability of the well control equipment is established firstly, the nodes changing with time in the static BN are determined, and the static BN is extended into a DBN; in terms of structure, the BNs for the degradation process and the maintenance process of the offshore oil well control equipment are the same, and the modeling is performed on the same set of offshore oil well control equipment; in terms of parameter modeling, priori probability of the BN for the maintenance process of the offshore oil well control equipment is decided by states of the components of the well control equipment, and the recovery process follows the Markov law;

the first layer nodes C1, C2, C3, C4, C5, C6, C7, C8, C9, C10, C11, C12, C13, C14 in the static BN are parent nodes, which represent basic components of the well control equipment, the second layer nodes M1, M2, M3, M4, M5, M6 are intermediate nodes, which represent series-parallel relations of the components of the well control equipment, the series-parallel relations are determined by a conditional transition probability table, the third layer nodes S1, S2, S3 represent subsystems in the offshore oil well control equipment, and the fourth layer node R represents the reliability of the offshore oil well control equipment;

the DBN is an extension of the static BN in time, wherein the first layer nodes are time clone nodes of the basic components C1, C2, C3, C4, C5, C6, C7, C8, C9, C10, C11, C12, C13, C14 of the well control equipment, which represent temporal change relations of the components of the offshore oil well control equipment, the second layer nodes C1, C2, C3, C4, C5, C6, C7, C8, C9, C10, C11, C12, C13, C14 represent the components of the well control equipment, the third layer nodes M1, M2, M3, M4, M5, M6 are intermediate nodes, which represent the series-parallel relations of the components of the well control equipment, the series-parallel relations are determined by the conditional transition probability table, the fourth layer nodes S1, S2, S3 represent subsystems in the offshore oil well control equipment, and the fifth layer node R represents the reliability of the offshore oil well control equipment; and step 6, calculating the resilience of the offshore oil well control equipment; the reliability versus the change in time of the offshore oil well control equipment after being subjected to disaster and maintenance measures are respectively obtained through the BN; and reliability degradation and recovery curves are drawn through the computational results of the BN, and the specific resilience value of the system is obtained by calculating an area ratio; wherein the calculation method is as follows: when the resilience value is calculated, a perpendicular line is drawn from a reliability point at the time of occurrence of the disaster to an x-axis, perpendicular lines are drawn from a reliability point at time of completion of the maintenance measures to x-axis and the y-axis respectively, an area enclosed by a curve and a straight line in the horizontal direction is called A1, and an area enclosed by the curve and two perpendicular lines as well as the x-axis is called A2, and the sum of A1 and A2 is the total area; and the ratio of the area of A2 to the total area is the required resilience value.

2. The method for evaluating the macro resilience of the offshore oil well control equipment of claim 1, wherein
when the components of the offshore oil well control equipment are subjected to a single-stress action,
S211, determining a degradation model of the offshore oil well control equipment component under the influence of the external disaster;
(1) when the well control equipment is influenced by temperature, the failure time of the component is shown in formula (1):

$$\frac{1}{t} = Ae^{-Ea/KT} \qquad (1)$$

wherein t is a pre-failure time of the component; A is a pre-exponential factor; Ea is an activation energy; K is the Boltzmann constant; and T is an absolute temperature, which is related to the strength of the disaster;
(2) when the well control equipment is influenced by humidity, the failure time of component is shown in formula (2):

$$t = (RH)^{-n} \cdot \exp(Ea/KT) \qquad (2)$$

wherein t is a pre-failure time; RH is a relative humidity, which is related to the strength of the external disaster; Ea is an activation energy; K is the Boltzmann constant, KJ/(mol·K); T is an absolute temperature; and n is an exponent, which value is a constant;
(3) when the well control equipment is influenced by vibration, the failure time of the component is shown in formula (3):

$$\Delta \varepsilon_p = C \times \frac{\sigma'_f}{E}(N_f)^{-n} \qquad (3)$$

wherein $\Delta \varepsilon_p$ is a strain range, which value is related to the strength of the external disaster; $\sigma'_f$ is a fatigue strength coefficient; E is an elastic modulus; and $N_f$ is the life cycle, that is, the failure time;
(4) when the well control equipment is influenced by electrical stress, the failure time of the component is shown in formula (4):

$$L = L_0 V^{-n} \qquad (4)$$

wherein L is a failure time; $L_0$ is a constant; n is an exponent; and V is the electrical stress, which value is related to the strength of the external disaster;

S212, mapping the degradation model of the components of the offshore oil well control equipment into a BN;
(1) the formula (1) is mapped into a BN, to obtain the failure time distribution and probability of the components of the well control equipment under the influence of temperature; the BN is divided into two layers: a first layer including four nodes of A, Ea, K, and T as an influence factor layer; and a second layer including one node of the failure time t as a result layer and the computational results indicate the failure time distribution and probability of the components of the offshore oil well control equipment under the influence of the temperature;
(2) the formula (2) is mapped into a BN, to obtain the failure time distribution and probability of the components of the well control equipment under the influence of the humidity; the BN is divided into two layers: a first layer including five nodes of Rh, Ea, k, T, and n as an influence factor layer; and a second layer including one node of the failure time t as a result layer, and the computational results indicate the failure time distribution and probability of the components of the offshore oil well control equipment under the influence of the humidity;
(3) the formula (3) is mapped into a BN, to obtain the failure time distribution and probability of the components of the well control equipment under the influence of the vibration; the BN is divided into two layers: a first layer including five nodes of C, E, $\varepsilon_p$, $\sigma_f$, and n as an influence factor layer; and a second layer including one node of the failure time $N_f$ as a result layer, and the computational results indicate the failure time distribution and probability of the components of the offshore oil well control equipment under the influence of the vibration;
(4) the formula (4) is mapped into a BN, to obtain the failure time distribution and probability of the components of the well control equipment under the influence of the electrical stress; the BN is divided into two layers: a first layer including three nodes of $L_0$, V, and n as an influence factor layer; and a second layer including one node of the failure time L as a result layer, and the computational results indicate the failure time distribution and probability of the components of the offshore oil well control equipment under the influence of the electrical stress;
S213, calculating the failure rates of the components of the offshore oil well control equipment under single-stress influence; calculating the failure rates of the components of the offshore oil well control equipment under single-stress influence through a weighting method;
when the components of the offshore oil well control equipment are subjected to a multi-stress action,
S221, determining a degradation model of the offshore oil well control equipment component under the influence of the external disaster; the degradation model formula is the same as that in step S211 except that: the number of degradation models of the components is greater than one under the multi-factor influence, and it is necessary to determine the degradation models of the components of the offshore oil well control equipment under different influence factors respectively;
S222, mapping the degradation model of the components of the offshore oil well control equipment into a BN; similar to step S212, the different degradation models are mapped into BNs, respectively, to obtain the failure time distribution and probability of the components of the offshore oil well control equipment under different influence factors;

S223, coupling the failure times of the components of the well control equipment under different influence factors; when the components of the well control equipment are influenced by multi-stress action, the single-factor failure times under single-stress influence are coupled using formula (5) after the failure times of the components under single-stress influence are determined respectively, and the formula (5) is mapped into a BN, to obtain the failure time distribution and probability of the components of the well control equipment under multi-factor influence;

$$D_{total} = \sum_{i=1}^{p} \frac{n_i}{N_i} \quad (5)$$

wherein $n_i$ is a coupling correction factor; $N_i$ is the failure times of the components under single-factor influence; and p is the number of influence factors.

* * * * *